(12) United States Patent
Berlin et al.

(10) Patent No.: US 6,298,013 B1
(45) Date of Patent: Oct. 2, 2001

(54) DEVICE FOR MONITORING THE TRAVEL TIME OF MAIL SHIPMENTS

(75) Inventors: Bernhard Berlin; Burghard Rebel; Andreas Berends; Eberhard Von Poeppinghausen, all of Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 08/152,009

(22) Filed: Nov. 15, 1993

(51) Int. Cl.$^7$ .......................... G04B 47/00; G04B 13/14; G04F 8/00; G06K 7/10
(52) U.S. Cl. .............................. 368/10; 368/11; 368/113; 235/377; 235/384; 235/487; 340/572.4; 340/572.8; 700/225
(58) Field of Search .................................. 368/10, 85–88, 368/107–113; 361/748–749, 750–761, 784, 789; 235/377, 384, 487; 340/572.4; 700/572.8, 225

(56) References Cited

U.S. PATENT DOCUMENTS

| 4,800,419 | * | 1/1989 | Long et al. ............................. | 357/70 |
| 5,008,496 | * | 4/1991 | Schmidt et al. ...................... | 174/254 |
| 5,072,400 |   | 12/1991 | Manduley ............................. | 364/478 |
| 5,079,673 | * | 1/1992 | Kodai .................................... | 361/400 |
| 5,093,761 | * | 3/1992 | Ozaki .................................... | 361/400 |
| 5,153,842 | * | 10/1992 | Dudos et al. ......................... | 364/478 |
| 5,386,342 | * | 1/1995 | Rostoker ............................... | 361/749 |
| 5,406,027 | * | 4/1995 | Matsumoto et al. .................. | 361/736 |
| 5,452,182 | * | 9/1995 | Ekhelberger et al. ................ | 361/749 |

FOREIGN PATENT DOCUMENTS

| 2657212 | 12/1976 | (DE) . |
| 3119884 | 5/1981 | (DE) . |
| 3220044 | 5/1982 | (DE) . |
| 3624718 | 7/1986 | (DE) . |
| 3918423 | 6/1989 | (DE) . |
| 3922121 | 7/1989 | (DE) . |
| 4107198 | 9/1991 | (DE) . |
| 4217266 | 5/1992 | (DE) . |
| 0512543 | 11/1992 | (JP) . |

OTHER PUBLICATIONS

Brochure of Firm Simflex GmbH & Co. KG, Fabrikweg, D–69465 Weinheim, Germany, 5 pages, undated, 1987 alleged.

139 Galavanotechnik, 77 (1986) Apr., No. 4, Salgau, Deutschlans, Leiterplatten–Technik, pp. 931 and 933.

* cited by examiner

Primary Examiner—Vit Miska
(74) Attorney, Agent, or Firm—Venable; Norman N. Kunitz

(57) ABSTRACT

A device for monitoring the travel time of mail shipments and including a motion sensor, a memory for compiling the measured motion values, an electronic evaluation unit and a current supply. The motion sensor, the memory for the measured values, the electronic evaluation unit and the current supply are arranged on a partially flexible support or circuit board that is configured such that it includes rigid circuit board portions for the arrangement of the motion sensor, the memory for the measured values and the electronic evaluation unit as well as the current supply and these rigid circuit board portions are connected with one another by flexible circuit board portions or components.

20 Claims, 1 Drawing Sheet

DEVICE FOR MONITORING THE TRAVEL TIME OF MAIL SHIPMENTS

CROSS REFERENCE TO RELATED APPLICATION

This application claims the priority of application Ser. No. P 42 38 102, filed Nov. 13th, 1992, in the Federal Republic of Germany, the subject matter of which is incorporated herein by reference.

BACKGROUND OF THE INVENTION

The present invention relates to a device for monitoring the travel time of mail shipments which includes a motion sensor, a memory for compiling the measured values and an electronic evaluation unit.

It is customary to monitor the travel time of mail shipments by using so-called delay monitors which are dispatched together with the mail shipments to be transported and include devices with which the motion sequences of the mail shipments are recorded. The devices of this type employed in the past include a motion sensor which records motion during the entire transit time of the shipment. The forces generated during transport of the mail shipments act on the sensor and the values determined by the sensor are retained in the form of a motion-over-time diagram. If the shipment is at rest, that is, it is not being transported, the sensor does not record anything. With this method it is possible to determine, for example, whether a shipment has lain at complete rest for several days in an undue manner after being transported for several hours.

The motion-over-time diagram recorded by the delay monitor can be evaluated at a central location and a desired/actual value comparison makes it possible to localize possibly existing stops in delivery or dispatch since the normal transporting paths and transporting times are known.

The delay monitors employed in the past have the drawback that they have a thickness of about 3 cm and that they are configured as a rigid unit in the form of a small package.

SUMMARY OF THE INVENTION

It is an object of the present invention to provide a delay monitoring apparatus with a device that has a thickness of ≦5 mm corresponding to the thickness of the usual letter and also has the letter format, the so-called C6 format. Moreover, this letter should have such a configuration that it can be processed in mail sorting machines and will not be separated out by post office personnel during a rigidity measurement in mail processing machines.

This is accomplished according to the present invention in that the motion sensor, the memory for the measured values and the electronic evaluation unit are disposed on a partially flexible circuit board of a configuration such that it includes rigid circuit board portions for the arrangement of the motion sensor, the measured value memory, and the electronic evaluation unit as well as the current supply for the device, and these rigid circuit board portions are connected with one another by flexible circuit board portions which support the rigid portions.

According to preferred features of the invention, the flexible circuit board portions or components are covered with an elastic or soft substance and arranged around the circuit component groups disposed on the rigid circuit board portions which are in turn covered by a casting substance. Preferably, the soft substance and the casting substance have a thickness such that a planar upper surface results for the device.

The device according to the invention for monitoring the travel time of mail shipments, due to the combination of rigid and flexible circuit board portions, makes it possible to sort by conventional mail distribution machines. Moreover, the covering with elastic pieces and the coating of the conductors and component groups with a casting substance and their encasement in a film completely prevents damage to the device while it is subjected to machine sorting.

BRIEF DESCRIPTION OF THE DRAWINGS

One embodiment of the apparatus according to the invention will be described below with reference to the drawing figures.

DETAILED DESCRIPTION OF THE PREFERRED EMBODIMENT

Figure 1:
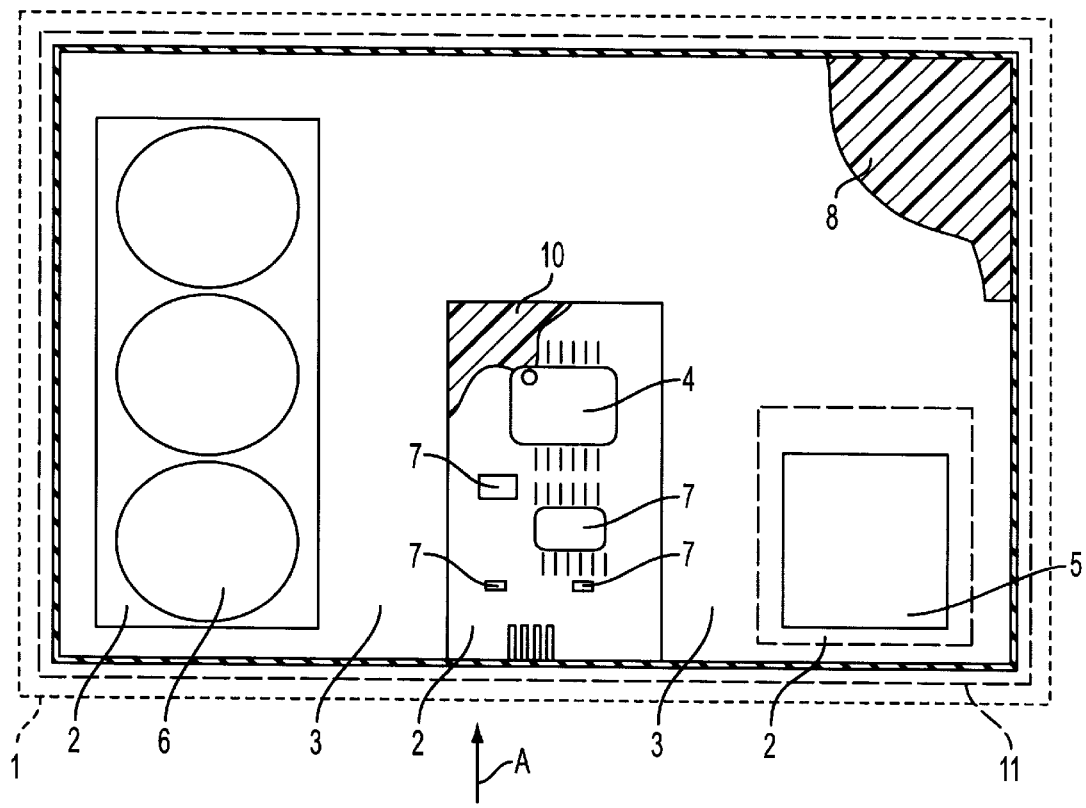
FIG. 1 is a schematic top view, partially cut away, of a preferred embodiment of a device according to the invention arranged within an envelope.

In FIG. 1, the reference numeral 1 identifies the outer edge of an envelope in which the entire device, including a circuit board with its components, is disposed. The circuit board is provided with rigid portions 2 and flexible portions or components 3. Motion sensor 5, the memory for measured values and the electronic evaluation unit are arranged on the partially flexible support or circuit board 2,3. A current supply 6 and a motion sensor 5 are arranged on the two outer rigid circuit board portions or components 2. The central rigid portion 2 of the circuit board accommodates a microcontroller 4 and other circuit components 7, e.g., the memory. Preferably, as shown, the circuit board 2,3 is rectangular.

According to the present invention, the rigid portions 2 of the circuit board are connected to one another by means of the flexible portions 3. The flexible portions 3 may be constituted by the portions of a support sheet, which extends over the entire bottom surface of the circuit board and on which the rigid circuit board portions are disposed, which are not covered by the rigid portions 2. As shown, the flexible portions 3 extend over the entire width of the circuit board so as to ensure the mobility of the mail shipments. Alternatively, and if desired, the rigid portions 2 may extend over the entire width (or length) of the circuit board, and the flexible portions 3 are simply strips extending between and interconnecting the rigid portions 2.

Figure 2:
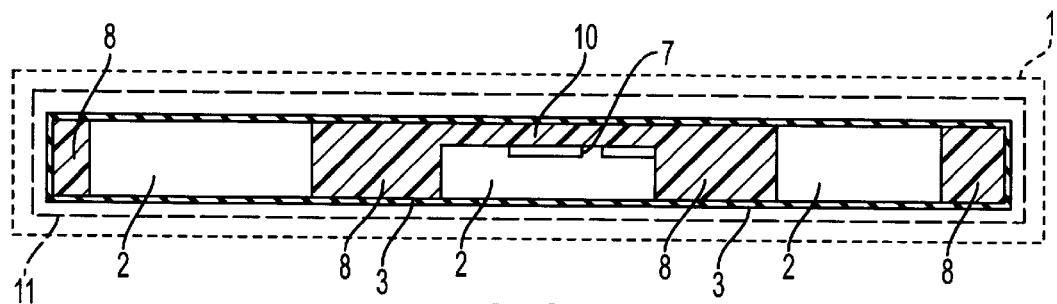
FIG. 2 is a schematic sectional of the device of FIG. 1 in the direction of arrow A to show the protective cover on the circuit board.

As shown in FIG. 2, these flexible portions or components 3 are provided with a soft covering 8. The rigid circuit board portions 2 disposed next to this covering 8 and carrying components 9 (see FIG. 3) are provided with a cast substance 10 on their top surfaces. The cast substance 10 and the covering 8 are of a thickness such that the respective portions covered therewith have the same height so that a closed, planar upper surface for the device results.

The entire arrangement is encased in a flexible sheet 11.

The flexible portions or components 3 may be configured as desired. It must merely be noted that the device, which has the shape and thickness of a letter, must have a certain rigidity to be able to pass through mail distribution systems. However, its rigidity must not be so great that it will be separated out.

As indicated above, in one embodiment the flexible portions 3 are configured as flexible portions of the circuit board disposed only between the rigid portions 2. In a further embodiment, the flexible portions 3 between the rigid portions 2 are configured as parts of a flexible sheet support. The flexible portions 3 may be provided with printed circuits to electrically interconnect the device circuit portions on the respective rigid circuit board portions 2.

Figure 3:
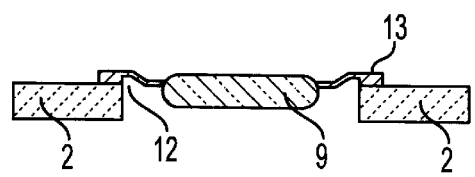
FIG. 3 is a schematic partial view showing the arrangement of a component on the rigid portions of the circuit board according to the invention.

FIG. 3 shows the arrangement of components 9 in recesses 12 of the rigid circuit board portions 2. Components 9 are arranged in such a manner that their projecting portions enter into recesses 12 and their connecting lugs 13 are soldered to the upper surfaces of the rigid circuit board portions 2.

It will be understood that the above description of the present invention is susceptible to various modifications, changes and adaptations, and the same are intended to be comprehended within the meaning and range of equivalents of the appended claims.

What is claimed is:

1. A device for dispatch via mail for monitoring the travel time of mail shipments with the device comprising a plurality of electrically interconnected electrical components including a motion sensor, a memory for compiling the measured motion values, an electronic evaluation unit, and a current supply; and wherein: the motion sensor, the memory for the measured values, the electronic evaluation unit and the current supply are disposed on a partially flexible circuit board of a configuration such that it includes rigid circuit board portions and flexible portions disposed between and connecting these rigid circuit board portions with one another; and the motion sensor, the measured value memory, the electronic evaluation unit and the current supply are mounted on the rigid portions of the circuit board.

2. A device as defined in claim 1, wherein said rigid circuit board portions are disposed on a sheet of flexible material in a spaced relationship so that said flexible portions of said circuit board are formed by portions of said sheet between said rigid portions.

3. A device as defined in claim 1, wherein the flexible circuit board portions are covered with a soft substance and the electrical components mounted on the rigid circuit board portions are covered by a casting substance.

4. A device as defined in claim 1, wherein said covered flexible and rigid circuit board portions have substantively the same height to provide a substantively planar surface.

5. A device as defined in claim 1, wherein the rigid circuit board portions are provided with recesses for accommodating circuit components having laterally extending connecting lugs, and said circuit components are mounted such that they project into the recesses with their said connecting lugs soldered to the top surface of the circuit board.

6. A device as defined in claim 1, further comprising a flexible sheet encasing said circuit board and its components.

7. A device according to claim 1, wherein said flexible portions are provided with printed circuits on their surface for interconnection of the circuit components on the respective rigid circuit board portions.

8. A device for dispatch as a letter by mail for monitoring the travel time of mail shipments with the device comprising a plurality of electrically interconnected electrical components including a motion sensor, a memory for compiling the measured motion values, an electronic evaluation unit, and a current supply; and wherein: said device has a share of a letter; the motion sensor, the memory for the measured values, the electronic evaluation unit and the current supply are disposed on a partially flexible circuit board which includes a plurality of laterally spaced rigid circuit board portions and a plurality of flexible portions disposed between and connecting at least adjacent ones of said rigid circuit board portions with one another; and the motion sensor, the measured value memory, the electronic evaluation unit and the current supply are mounted on the rigid portions of the circuit board.

9. A device as defined in claim 8, wherein the circuit board has a rectangular configuration, said plurality of rigid circuit board portions are all laterally spaced in one of the length and width directions of the rectangular circuit board; and, the flexible portions extend in the form of strips over the entire other one of the length or width directions of the rectangular circuit board.

10. A device as defined in claim 9, wherein the rigid circuit board portions have a rectangular configuration.

11. A device as defined in claim 8, wherein said plurality of rigid circuit board portions are disposed on one surface of a sheet of flexible material in a laterally spaced relationship, and said flexible portions of said circuit board are formed by portions of said sheet extending between said rigid portions.

12. A device as defined in claim 11, wherein the circuit board has a rectangular configuration, and said plurality of rigid circuit board portions are all laterally spaced in the same one of the length and width directions of the rectangular circuit board.

13. A device as defined in claim 12, wherein the rigid circuit board portions have a rectangular configuration.

14. A device as defined in claim 12, wherein the sheet of flexible material is rectangular, extends to the respective edges of said circuit board, and surrounds said plurality of rigid circuit board portions.

15. A device as defined in claim 8, wherein the flexible circuit board portions are covered with a soft substance and the electrical components mounted on the rigid circuit board portions are covered by a hard casting substance.

16. A device as defined in claim 15, wherein said covered flexible and rigid circuit board portions have substantively the same height to provide a substantively planar surface.

17. A device as defined in claim 8, wherein at least some of the rigid circuit board portions are provided with recesses in a top surface for accommodating circuit components having laterally extending connecting lugs, and said circuit components are mounted such that they project into the recesses and have their said connecting lugs soldered to the top surface of the respective rigid circuit board portion.

18. A device as defined in claim 8, further comprising a flexible sheet encasing said circuit board and the components mounted thereon.

19. A device according to claim 8, wherein said flexible portions are provided with printed circuits on their surface for interconnection of the circuit components on the respective rigid circuit board portions.

20. A device as defined in claim 8 wherein said device has a thickness equal to or less than 5 mm.

* * * * *